(12) United States Patent  (10) Patent No.: US 8,723,103 B2
Shaffer  (45) Date of Patent: May 13, 2014

(54) OPTICAL ENCODER READHEAD CONFIGURED TO BLOCK STRAY LIGHT WITH DUMMY VIAS

(75) Inventor: Jamie Shaffer, Bothell, WA (US)

(73) Assignee: Mitutoyo Corporation, Kawasaki-shi (JP)

( * ) Notice: Subject to any disclaimer, the term of this patent is extended or adjusted under 35 U.S.C. 154(b) by 143 days.

(21) Appl. No.: 13/291,905

(22) Filed: Nov. 8, 2011

(65) Prior Publication Data

US 2013/0112859 A1 May 9, 2013

(51) Int. Cl.
*G01D 5/26* (2006.01)
*H01J 40/00* (2006.01)
*H01J 5/02* (2006.01)

(52) U.S. Cl.
USPC ...................................... 250/231.1; 250/239

(58) Field of Classification Search
USPC ............ 250/231.1, 231.13, 231.14, 221, 239; 356/614–617; 359/436; 341/13, 11; 33/1 R, 1 D, 1 M, 1 L; 369/44.38, 44.39
See application file for complete search history.

(56) References Cited

U.S. PATENT DOCUMENTS

| | | | |
|---|---|---|---|
| 7,608,813 B1 * | 10/2009 | Milvich et al. | 250/231.13 |
| 7,859,189 B2 | 12/2010 | Young | |
| 2009/0160983 A1 | 6/2009 | Lenchenkov | |
| 2012/0168890 A1 * | 7/2012 | Cheung et al. | 257/435 |

* cited by examiner

*Primary Examiner* — Georgia Y Epps
*Assistant Examiner* — Carolynn A Moore
(74) *Attorney, Agent, or Firm* — Christensen O'Connor Johnson Kindness PLLC

(57) ABSTRACT

An optical readhead for measuring a displacement along a measuring axis direction between the readhead and a scale track comprises an illumination portion configured to output source light to the scale track and a monolithic detector configuration. The monolithic detector configuration comprises: a first track photodetector portion configured to receive scale light from the scale track; a first metal layer; a second metal layer; and a plurality of dummy vias between the first metal layer and the second metal layer. The plurality of dummy vias is arranged to block light transmission along a layer between the first and second metal layers, and the plurality of dummy vias is formed by the same process steps used to fabricate a plurality of active vias used to connect circuit elements on the monolithic detector configuration.

5 Claims, 4 Drawing Sheets

OPTICAL ENCODER READHEAD CONFIGURED TO BLOCK STRAY LIGHT WITH DUMMY VIAS

FIELD OF THE INVENTION

The invention relates generally to precision position or displacement measurement instruments such as optical encoders, and more particularly to an optical encoder readhead.

BACKGROUND OF THE INVENTION

Optical position encoders determine the displacement of a readhead relative to a scale that includes a pattern that is detected by the readhead. Typically, position encoders employ a scale that includes at least one scale track that has a periodic pattern, and the signals arising from that scale track are periodic as a function of displacement or position of the readhead along the scale track. Absolute type position encoders may use multiple scale tracks to provide a unique combination of signals at each position along an absolute scale.

In various applications, an optical encoder readhead will comprise multiple metal layers within detector electronics. In some embodiments, the metal layers may be used to block light which may affect circuitry components such as transistors, diodes or other components which may be undesirably affected by stray light which will result in undesirable signal corruption. It is desirable in various applications for a readhead to be as compact as possible and for the detector electronics of such a readhead to comprise a monolithic detector configuration within a single integrated circuit. As a readhead becomes more compact, the possibility of stray light resulting in corrupted signals becomes stronger, especially as metal layers have shorter overlap distances. Stray light is a larger problem with light that is not constant, e.g., light which is reflected or transmitted by a scale which comprises a periodic pattern varying according to displacement of the readhead along the scale track. It is therefore desirable to avoid light transmission along a layer between metal layers to components which are not intended to sense light which may result in signal corruption.

SUMMARY OF THE INVENTION

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

The present invention is directed to an optical readhead for measuring a displacement along a measuring axis direction between the readhead and a scale track and in particular, reducing the effects of stray light on circuitry components of an optical readhead.

In various embodiments, such an optical readhead may comprise an illumination portion configured to output source light to the scale track and a monolithic detector configuration. The monolithic detector configuration may comprise a first track photodetector portion configured to receive scale light from the scale track; a first metal layer; a second metal layer; and a plurality of dummy vias between the first metal layer and the second metal layer. The plurality of dummy vias may be arranged to block light transmission along a layer between the first and second metal layers, and the plurality of dummy vias may be formed by the same process steps used to fabricate a plurality of active vias used to connect circuit elements on the monolithic detector configuration.

In some embodiments, the scale track may comprise a first track portion and a second track portion which are parallel to one another; the first track photodetector portion may be configured to receive scale light from the first scale track portion; and the monolithic detector configuration may further comprise a second track photodetector portion which is configured to receive scale light from the second scale track portion.

In some embodiments, the plurality of dummy vias may not be electrically connected to current-carrying circuit elements on the monolithic detector configuration.

In some embodiments, the plurality of dummy vias may comprise at least one dummy via which comprises a cross section which is elongated along one direction.

In some embodiments, the plurality of dummy vias may be arranged adjacent to an edge of the first metal layer in at least one row which is parallel to the edge of the first metal layer.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Figure 1:
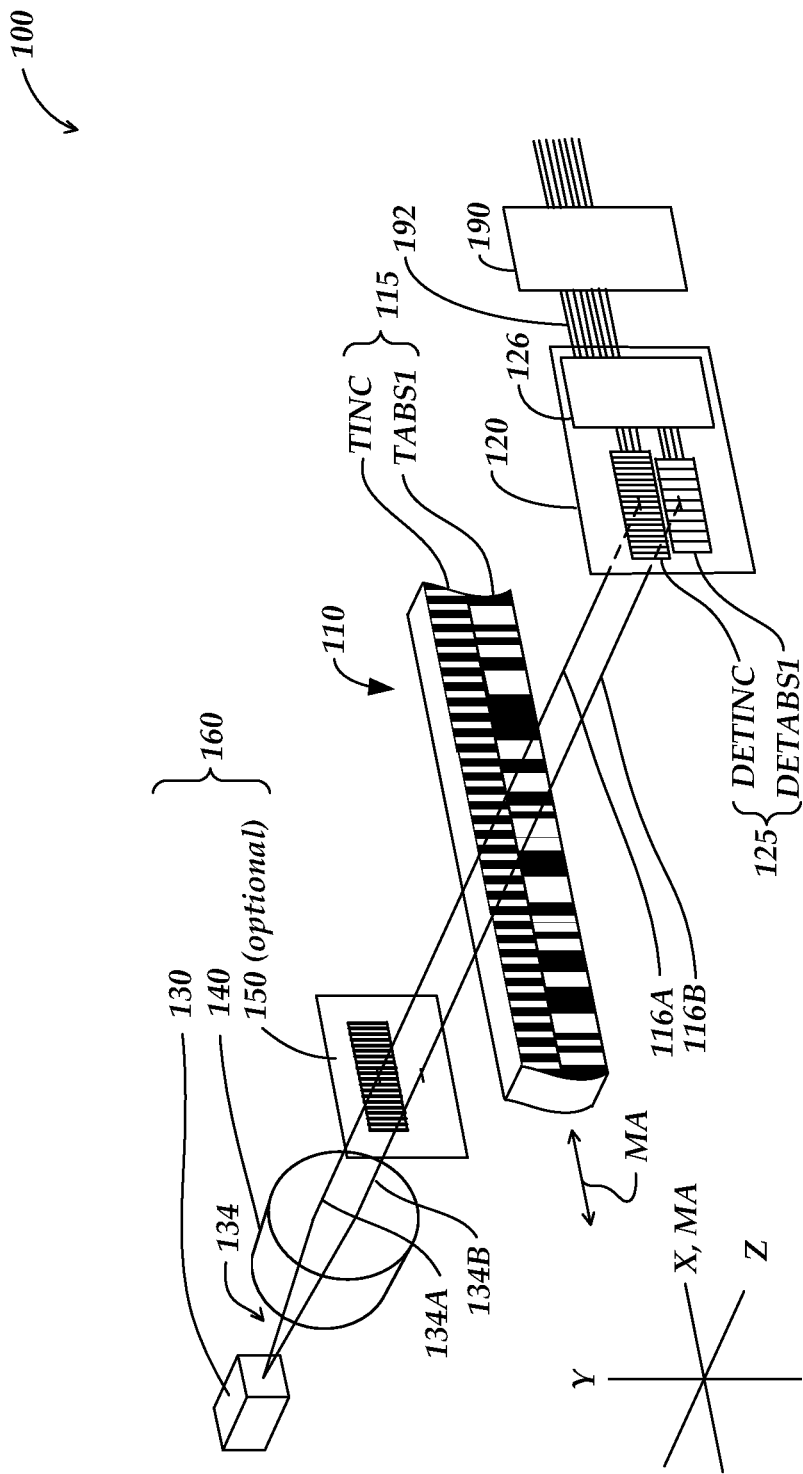
FIG. 1 is an exploded diagram of one embodiment of an optical encoder configuration.

FIG. 1 is an exploded diagram schematically illustrating one embodiment of an optical encoder configuration 100 that can employ detector configurations disclosed herein. As shown in FIG. 1, the encoder configuration 100 includes a scale element 110, signal processing electronics 120 which is connected to signal generating and processing circuitry 190 by power and signal connections 192, and an illumination system or portion 160 comprising a light source 130 for emitting visible or invisible wavelengths of light, a lens 140, and an optional source grating 150. The light source 130 may also be connected to the signal generating and processing circuitry 190 by power and signal connections (not shown). In the example shown in FIG. 1, the scale element 110 includes an absolute scale pattern 115 including two scale track patterns: an incremental track pattern TINC and an absolute track pattern TABS1. The track pattern TABS1 is referred to as an absolute scale track pattern because it provides signals usable to determine an absolute position over an absolute measuring range determined by its configuration. FIG. 1 also shows orthogonal X, Y, and Z directions, according to a convention used herein. The X and Y directions are parallel to the plane of the absolute scale pattern 115, with the X direction parallel to the intended measuring axis direction MA (e.g., perpendicular to elongated grating pattern elements that may be including in the incremental track pattern TINC). The Z direction is normal to the plane of the absolute scale pattern 115.

The signal processing electronics 120 includes a monolithic detector configuration 125 comprising two detector tracks or portions DETINC and DET1 arranged to receive light from the scale track patterns TINC and TABS1, respectively. The signal processing electronics 120 may also include an analyzer portion 126 (e.g., signal adjusting, amplifying and/or combining circuits, and/or comparing circuits, etc.). In various embodiments, the signal processing electronics 120 may be fabricated as a single monolithic CMOS IC. As described in greater detail below, the detector configurations and signal processing systems and methods disclosed herein may be adapted for use with either or both detector tracks or portions DETINC and DET1 that receive light from the scale track patterns TINC and TABS1.

In operation, source light 134 output from the light source 130 may be partially or fully collimated by the lens 140 over a beam area sufficient to illuminate the scale track patterns. FIG. 1 schematically shows two light paths 134A and 134B of the source light 134. The light path 134A is a representative path including light that illuminates the scale track pattern TINC. When the scale track pattern TINC is illuminated, it outputs a periodic spatially modulated light pattern corresponding to the scale track pattern TINC (e.g., interference fringe light from diffracted orders, in some embodiments) along a light path 116A to the detector portion DETINC of the signal processing electronics 120. The light path 134B is a representative path including light that illuminates the scale track pattern TABS1. When the scale track pattern TABS1 is illuminated, it outputs patterns such as periodic spatially modulated light patterns (e.g., patterned light corresponding to its pattern) or coded light patterns along light path 116B to the detector portion DETABS1 of the signal processing electronics 120. In various embodiments, the encoder configuration 100 may be configured such that the track pattern TABS 1 produces a shadow image (e.g., a blurred or unblurred shadow image) projected onto the detector portion DETABS1. It will be appreciated that all spatially modulated light patterns move in tandem with the scale 110. In each of the detector portions DETINC and DET1, individual photodetector areas are arranged to spatially filter their respective received spatially modulated light pattern to provide desirable position indicating signals (e.g., quadrature signals, or other periodic signals having a spatial phase relationship that is conducive to signal interpolation). In some embodiments, rather than individual photodetector areas, a spatial filter mask with individual apertures may mask relatively larger photodetectors to provide light-receiving areas analogous to the individual photodetector areas illustrated to provide a similar, overall signal effect according to known techniques.

In some moderate resolution embodiments (e.g., with fine track wavelengths on the order of 40 microns, or more), the encoder configuration 100 may be configured such that the track pattern TINC produces a shadow image projected onto the detector track DETINC. In relatively higher resolution embodiments, the track pattern TINC is generally configured to produce diffracted light. In some embodiments, for example, those having a fine track wavelength of approximately 8 microns or less, the encoder configuration 100 may be configured according to known methods such that diffracted orders (e.g., +/1 first orders) produce interference fringes that reach the detector track DETINC, according to known methods. In such embodiments, the source grating 150 is generally omitted. In other embodiments, for example, those having a fine track wavelength of approximately 8-40 microns, the encoder configuration 100 may be configured according to known methods such that several diffracted orders interact to produce a self image (e.g., a Talbot image or a Fresnel image) at the plane of the detector track DETINC. In self-imaging configurations, the light source 130 may be an LED. The source grating 150 may be omitted, or optional, in some embodiments where the light source dimensions are small enough. However, when using an extended source, the source grating 150 may be needed in order to provide the most desirable self imaging. In such a case, the light surrounding the representative light path 134A passes through the grating structure of the source grating 150 to provide an array of partially coherent illumination sources at the grating openings, which are arranged with a pitch approximately matching the pitch or wavelength of the track pattern TINC, to illuminate the scale track pattern TINC according to known self-imaging illumination principles. FIG. 1 shows an embodiment of the source grating 150 that allows the representative light path 134B to pass through a transparent substrate of the source grating 150 so that their intensity and degree of collimation, which contributes to the quality of the signals from the detector track DETABS1, is not disrupted by the grating structure of the source grating 150. In other embodiments, the representative light paths 134B may also pass through a grating structure on the source grating 150; however, this is not an optimum configuration.

In various applications, the signal processing electronics 120 and illumination system 160 are mounted in a fixed relationship relative to one another, e.g., in a readhead or gauge housing (not shown), and are guided along the measuring axis relative to the scale 110 by a bearing system, according to known techniques. The scale may be attached to a moving stage, or a gauge spindle, or the like, in various applications. The configuration shown in FIG. 1 is a transmissive configuration. The scale pattern 115 comprises light-blocking portions and light-transmitting portions (e.g., fabricated on a transparent substrate using known thin-film patterning techniques, or the like) that output the spatially modulated light patterns to the detector tracks by transmission. It will be appreciated that similar components may be arranged in reflective embodiments wherein the illumination system 160 and the signal processing electronics 120 are arranged on the same side of the scale 110 and positioned for angled illumination and reflection, if necessary, according to known techniques. The optical encoder configuration 100 may be further understood by reference to similar embodiments disclosed in U.S. Pat. No. 7,608,813, which is hereby incorporated herein by reference in its entirety.

It will be appreciated that for the purposes of this disclosure, the sequence and arrangement of the scale and detector tracks along the Y axis direction in FIG. 1, which provide an absolute encoder configuration, is exemplary only and not limiting. For example, a second track pattern may be arranged adjacent to the fine track pattern TINC for more robust absolute detection.

It should be appreciated that principles for configuring an optical readhead described in later figures may also apply to a scale which uses a single scale track, e.g., a scale track similar to TINC or TABS. The optical encoder configuration 100 is exemplary and not limiting, its purpose being to demonstrate a typical optical encoder configuration, which may comprise an optical readhead as configured according to later figures.

Figure 2:
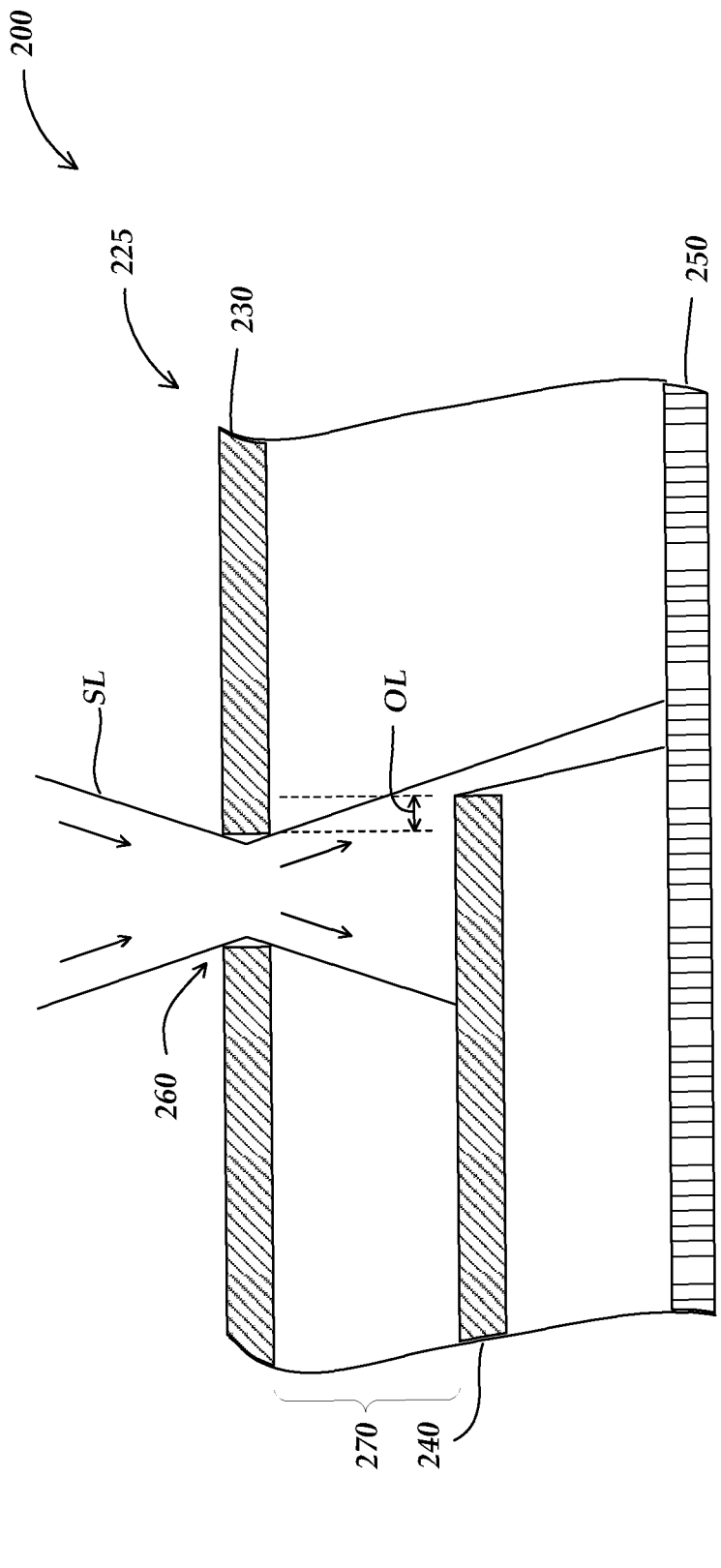
FIG. 2 is a cross section diagram of a portion of a detector configuration of an optical readhead.

FIG. 2 is a cross section diagram of a portion of a monolithic detector configuration 225 of an optical readhead 200. The monolithic detector configuration 225 may be similar or analogous to the monolithic detector configuration 125 of FIG. 1. The detector configuration 225 comprises a first track photodetector portion (e.g., the detector portion DETINC of FIG. 1, not shown) configured to receive scale light from a scale track (e.g., the scale element 110), a first metal layer 230, a second metal layer 240, and a component layer 250. The first metal layer 230 comprises a slot 260. A portion of the first metal layer 230 which is to the right of the slot 260 overlaps the second metal layer 240 by an overlap distance OL along the Y axis. Slots such as the slot 260 may correspond to open portions of phase masks corresponding to photodetector portions, but slots are additionally required for manufacturing various layers within an IC.

FIG. 2 demonstrates a typical problem in a compact optical readhead. The overlap distance OL of the metal layer 230 and the metal layer 240 must be small to maintain a compact configuration. In some exemplary instances, it is necessary for the overlap distance OL to be smaller than 10 microns. As a result, a portion of scale light SL (e.g., light output from a scale track portion such as scale track portion TINC or scale track portion TABS1 along the light path 116A or the light path 116B shown in FIG. 1) may be transmitted along a layer 270 between the metal layer 230 and the metal layer 240 such that it is incident upon the component layer 250. This portion of the scale light SL may be incident upon components such as photodetectors, transistors, or diodes, thus altering signals transmitted therein and creating undesirable signal corruption. Ordinarily, a sufficiently large overlap distance OL may allow an optical readhead to avoid such signal corruption, but in a compact configuration, this is not always possible. Therefore, it is desirable to block such stray light through a different means.

Figure 3:
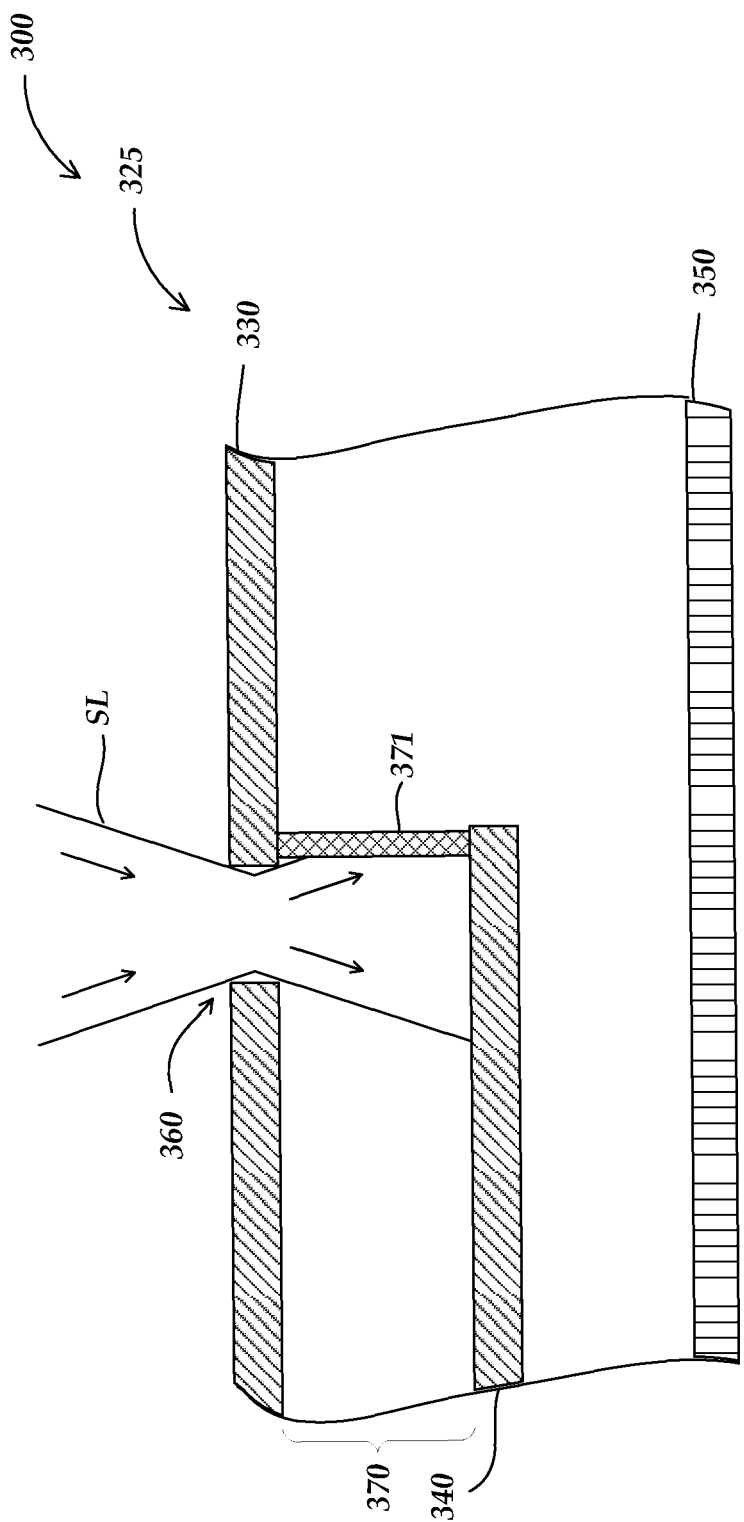
FIG. 3 is a cross section diagram of a portion of a detector configuration of an optical readhead which is configured to block stray light.

FIG. 3 is a cross section diagram of a portion of a detector configuration 325 of an optical readhead 300 which is configured to block stray light. Elements with 3XX series numbers in FIG. 3 that have the same "XX" suffix as 2XX series numbers in FIG. 2 may designate similar or identical elements unless otherwise indicated. In the embodiment shown in FIG. 3, the detector configuration 325 additionally comprises a dummy via 371 between the first metal layer 330 and the second metal layer 340. The dummy via 371 is arranged to block light transmission along a layer 370 between the first metal layer 330 and the second metal layer 340. It should be appreciated that the dummy via 371 is exemplary for demonstrating its function. In various embodiments, an optical readhead such as the optical readhead 300 comprises a plurality of dummy vias which are similar to the dummy via 371 arranged along an edge of a metal layer. Experimental results indicate that a plurality of dummy vias is frequently more effective for suppressing signal corruption than a larger overlap distance OL, e.g., on the order of 10 microns.

In various optical readhead embodiments, a plurality of dummy vias is formed by the same process steps used to fabricate a plurality of active vias used to connect circuit elements on a detector configuration. In some embodiments, the plurality of dummy vias is not electrically connected to current-carrying circuit elements on the monolithic detector configuration, i.e., they serve no function in the circuitry itself, but are only present for blocking stray light. Since dummy vias are formed by the same process steps as active vias, an optical readhead may be manufactured to include robustness with respect to stray light with a low cost and a convenient method which does not require additional or specialized manufacturing steps. It should be appreciated that a typical monolithic detector configuration may comprise more than two layers and dummy vias may be placed between various layers as needed to shield stray light.

Figure 4:
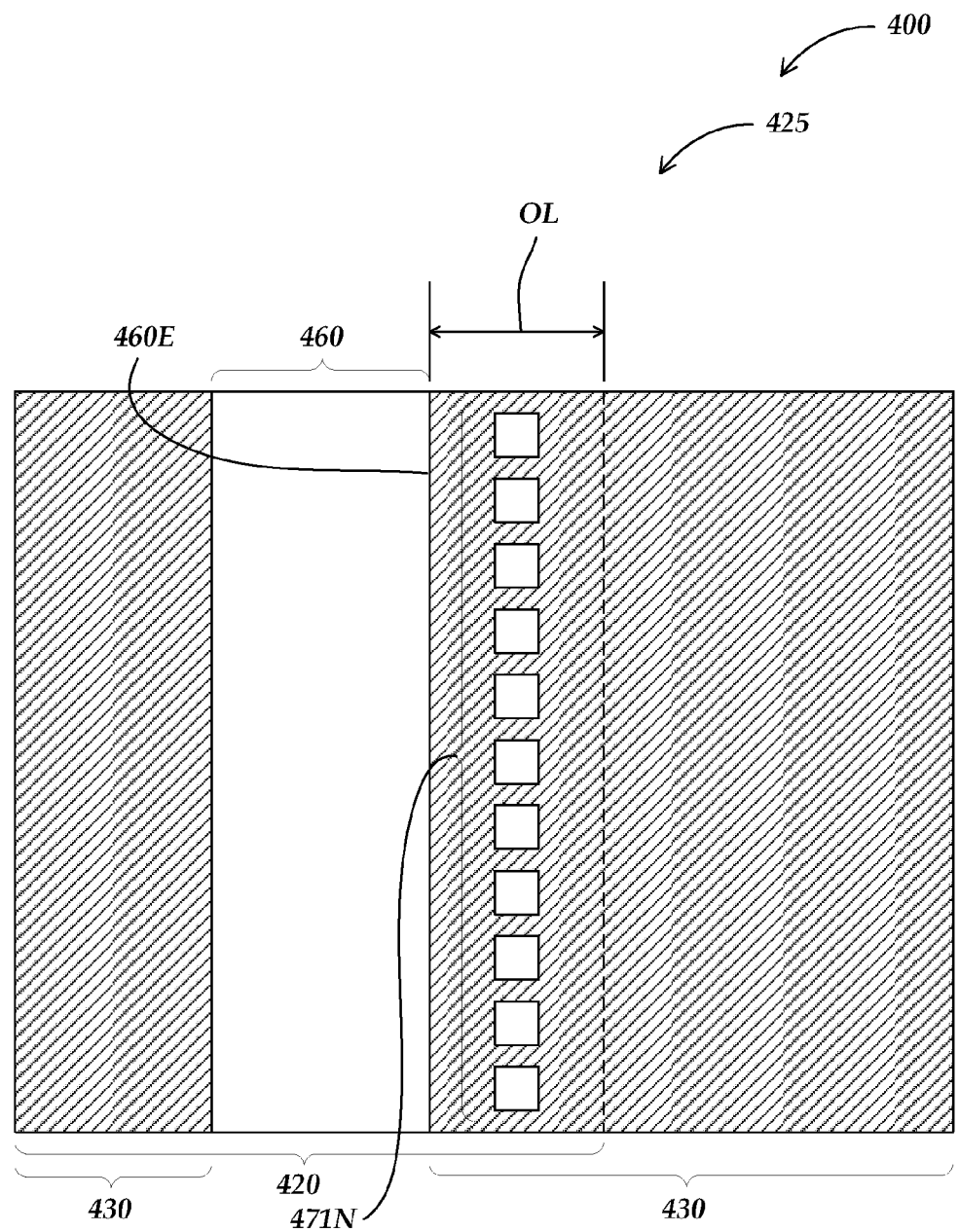
FIG. 4 is a top view diagram of a portion of a detector configuration of an optical readhead which is configured to block stray light.

FIG. 4 is a top view diagram of a portion of a detector configuration 425 of an optical readhead 400 which is configured to block stray light. Elements with 4XX series numbers in FIG. 4 that have the same "XX" suffix as 3XX series numbers in FIG. 3 may designate similar or identical elements unless otherwise indicated. FIG. 4 shows a set of dummy vias 471N between the first metal layer 430 and the second metal layer 420. The set of dummy vias 471N comprises vias with a generally square cross section. However, it should be appreciated that in some embodiments, the set of dummy vias 471N may have a cross section which is elongated along a direction parallel to the slot 460. Elongated dummy vias shield a greater portion of light than vias with a square cross section. It should be appreciated that the set of dummy vias 471N are arranged in a single row adjacent to the slot 460 and parallel to an edge 460E of the first metal layer 430, but this is exemplary and not limiting. In various embodiments, they may be arranged in multiple rows adjacent to the slot 460 to provide stronger light shielding. The orientation of the slot 460 is exemplary and not limiting. A set of dummy vias may be placed adjacent to an edge of the first metal layer corresponding to a slot of any orientation.

While the preferred embodiment of the invention has been illustrated and described, numerous variations in the illustrated and described arrangements of features and sequences of operations will be apparent to one skilled in the art based on this disclosure. Thus, it will be appreciated that various changes can be made therein without departing from the spirit and scope of the invention.

The invention claimed is:

1. An optical readhead for measuring a displacement along a measuring axis direction between the readhead and a scale track, the optical readhead comprising:
   an illumination portion configured to output source light to the scale track; and
   a monolithic detector configuration comprising:
     a first track photodetector portion configured to receive scale light from the scale track;
     a first metal layer;
     a second metal layer; and
     a plurality of dummy vias between the first metal layer and the second metal layer,
     wherein the plurality of dummy vias is arranged to block light transmission along a layer between the first and second metal layers, and the plurality of dummy vias is formed by the same process steps used to fabricate a plurality of active vias used to connect circuit elements on the monolithic detector configuration.

2. The optical readhead of claim 1, wherein:
   the scale track comprises a first track portion and a second track portion which are parallel to one another;
   the first track photodetector portion is configured to receive scale light from the first scale track portion; and
   the monolithic detector configuration further comprises a second track photodetector portion which is configured to receive scale light from the second scale track portion.

3. The optical readhead of claim 1, wherein the plurality of dummy vias is not electrically connected to current-carrying circuit elements on the monolithic detector configuration.

4. The optical readhead of claim 1, wherein the plurality of dummy vias comprises at least one dummy via which comprises a cross section which is elongated along one direction.

5. The optical readhead of claim 1, wherein the plurality of dummy vias is arranged adjacent to an edge of the first metal layer in at least one row which is parallel to the edge of the first metal layer.

* * * * *